(12) United States Patent
Lee et al.

(10) Patent No.: US 9,054,089 B2
(45) Date of Patent: Jun. 9, 2015

(54) LEAD FRAME PACKAGE HAVING DISCHARGE HOLES AND METHOD OF MANUFACTURING THE SAME

(71) Applicant: Amkor Technology, Inc., Chandler, AZ (US)

(72) Inventors: Kyoung Yeon Lee, Gyeonggi-do (KR); Byong Jin Kim, Gyeonggi-do (KR); Kyung Su Kim, Gyeonggi-do (KR); Hyung Il Jeon, Gyeonggi-do (KR); Jae Doo Kwon, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/949,186

(22) Filed: Jul. 23, 2013

(65) Prior Publication Data
US 2014/0042605 A1 Feb. 13, 2014

(30) Foreign Application Priority Data

Aug. 8, 2012 (KR) .................. 10-2012-0086819

(51) Int. Cl.
*H01L 23/495* (2006.01)
*H01L 21/50* (2006.01)
*H01L 23/498* (2006.01)

(52) U.S. Cl.
CPC .......... *H01L 23/49503* (2013.01); *H01L 21/50* (2013.01); *H01L 23/49541* (2013.01); *H01L 23/49861* (2013.01); *H01L 2924/0002* (2013.01)

(58) Field of Classification Search
USPC ......... 257/676, 773, 774, 678, 692, 684, 685, 257/731, 776, 777, 784, 666, 672, E23.031, 257/667, E23.052, E21.499; 438/123, 106, 438/10, 121, 280, 617, 118
See application file for complete search history.

(56) References Cited

U.S. PATENT DOCUMENTS

| | | | | |
|---|---|---|---|---|
| 6,373,127 | B1 * | 4/2002 | Baudouin et al. ............ | 257/676 |
| 6,760,970 | B2 * | 7/2004 | Farnworth et al. ........... | 29/842 |
| 7,838,980 | B1 * | 11/2010 | Lee et al. ...................... | 257/692 |
| 8,097,934 | B1 * | 1/2012 | Li et al. ......................... | 257/667 |
| 8,129,222 | B2 * | 3/2012 | Tan et al. ...................... | 438/118 |
| 2005/0139969 | A1 * | 6/2005 | Lee et al. ...................... | 257/672 |
| 2006/0289973 | A1 * | 12/2006 | Lee ................................ | 257/666 |
| 2012/0080781 | A1 * | 4/2012 | Li et al. ......................... | 257/676 |
| 2012/0104584 | A1 * | 5/2012 | Chen et al. .................... | 257/676 |
| 2014/0080264 | A1 * | 3/2014 | Chan et al. .................... | 438/123 |

FOREIGN PATENT DOCUMENTS

KR  10-2012-0070213  6/2012

* cited by examiner

*Primary Examiner* — Alexander Oscar Williams
(74) *Attorney, Agent, or Firm* — Kevin B. Jackson

(57) ABSTRACT

In one embodiment, a lead frame package structure includes a lead frame having sides that surround a die paddle and on which a plurality of leads are formed. An electronic chip is attached to the die paddle and a case is attached to the lead frame to seal the leads and the electronic chip. One or more discharge holes are formed on and extending through one or more specific leads and/or on and extending through a predetermined position of the die paddle. The discharge holes are configured to discharge air pressure that forms during the assembly process thereby improving the reliability of the packaged electronic chip.

20 Claims, 5 Drawing Sheets

LEAD FRAME PACKAGE HAVING DISCHARGE HOLES AND METHOD OF MANUFACTURING THE SAME

CROSS REFERENCE TO RELATED APPLICATIONS

This application claims priority to Korean Patent Application No. 10-2012-0086819 filed on Aug. 8, 2012, which is expressly incorporated by reference herein.

BACKGROUND

The present invention relates to electronic packaging, and more particularly to a lead frame package that is configured to mount an electronic device for a vehicle thereon, and a method for manufacturing the same.

As is well known, vehicles typically include a number of sensor devices mounted at various locations for measuring certain physical parameters and providing electrical signals for electronic control or for providing a warning message to the occupant. Such sensors include acceleration sensors, wheel speed sensors, slope sensors, knock sensors, vehicle speed sensors, temperature sensors, air pressure sensors, and the like. Typically, the sensors are assembled as a packaged structure configured for mounting to the vehicle.

An electronic sensor package for a vehicle typically is manufactured through a series of process steps, which includes attaching an electronic sensor chip onto a die paddle of a lead frame. The lead frame typically has a plurality of leads that surround the die paddle. The manufacturing process also includes forming a continuous molded frame that surrounds and encapsulates the lead frame, connecting the respective leads to corresponding bond pads located on the electronic sensor chip through conductive wires and sealing the respective leads and the electronic sensor chip with a cover. Such a process is described, for example, in Korean Unexamined Patent Publication No. 2012-0070213 (published on Jun. 29, 2012). In order to protect the electronic sensor chip from the harsh environment internal and external to the vehicle, the cover in the related packages is configured as a solid piece of material without holes, which attaches to the molded frame to form a sealed structure. One problem with this package structure is that the cover may become tilted or may separate or rotate away from the rest of the structure during assembly. It is believed that this defect is caused by air pressure build-up when the cover is attached to seal the electronic sensor device. This defect can cause reliability problems because, among other things, the electronic sensor is exposed to the harsh environment.

Accordingly, it is desirable to have a structure and method that improve the reliability of electronic sensor packages including those configured for vehicle applications.

Figure 1:
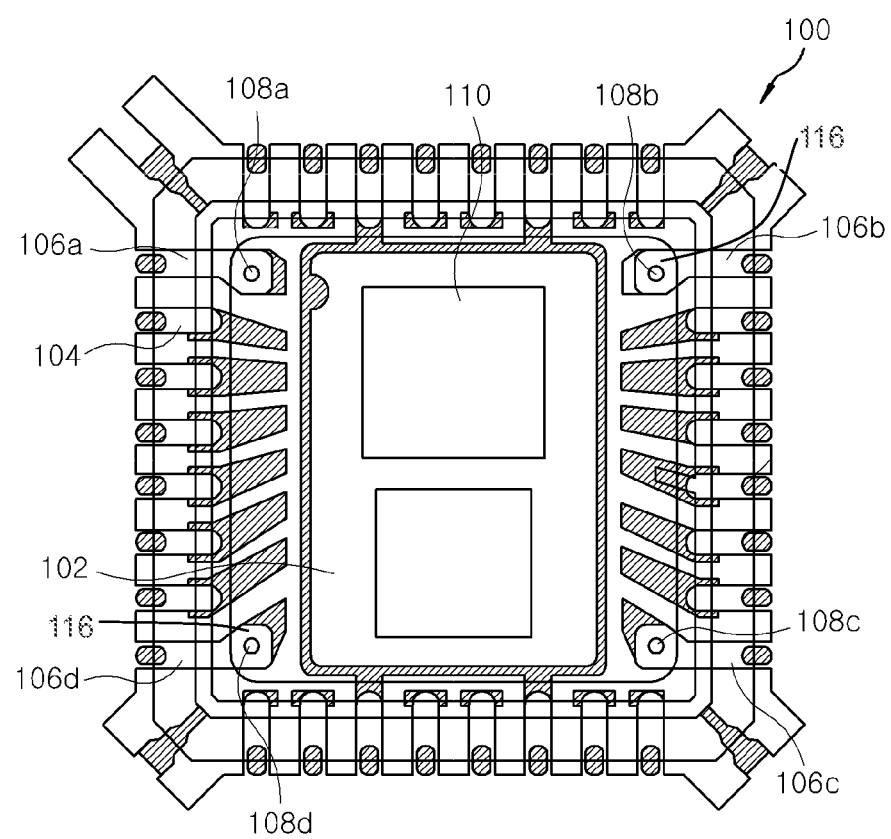
FIG. 1 illustrates a top plan view of a lead frame package according to an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description.

DETAILED DESCRIPTION OF THE DRAWINGS

The aspects of the present invention and methods for achieving the aspects will be apparent by referring to the embodiments to be described herein with reference to the accompanying drawings. It is understood that the embodiments described herein are illustrative only and that the present invention is not limited thereto, but can be implemented in alternative forms. In the following description, window, cover, and case may be used interchangeably.

In accordance with the present embodiments, one or more discharge holes are formed in one or more specific leads and/or in specific location(s) on a die paddle. The discharge holes are within a cavity formed by a cover attached to leadframe. Compared to related art semiconductor packages in which no holes are formed on the upper portion of a cover and the molded frame is intended to be sealed, the one or more discharge holes in accordance with the present embodiments reduce unwanted problems with tilting, separating, or rotating covers as well as other problems.

In one embodiment, the present description pertains to a lead frame package structure having a lead frame that includes a die paddle and plurality of leads in proximity to the die paddle. A discharge hole extends through at least one specific lead of the plurality of leads and an electronic chip (for example, a sensor device) is attached to one side of the die paddle. A case is attached to the lead frame and covering at least portions of the plurality of leads, the discharge hole, and the electronic chip.

In another embodiment, the present description pertains to a lead frame package structure that includes a lead frame having sides, which surround a die paddle and on which a plurality of leads are formed in proximity to a die paddle. One or more discharge holes extend through predetermined locations on the lead frame. An electronic chip (for example, a sensor device) is on the die paddle and a cover is adhered to the lead frame to form a cavity that seals the electronic chip and at least portions of plurality of leads and the die paddle, wherein the one or more discharge holes are within the cavity. In one embodiment, the predetermined locations can include location on specific leads of the plurality of leads. In one embodiment, the predetermined locations can include one or more locations on the die paddle. In one embodiment, the predetermined locations can include one or more locations on specific leads and one or more locations on the die paddle.

In a further embodiment, the present description pertains to a method for manufacturing a lead frame package, which includes providing a lead frame having sides, which surround a die paddle and on which a plurality of leads are formed, and discharge holes extending through the lead frame on one or more locations. The method includes attaching an electronic chip (for example, a sensor device) to the die paddle, and attaching a case for sealing the plurality of leads and the electronic chip to the lead frame.

It is understood that the features of the various embodiments described herein can be combined with each other, unless specifically noted otherwise.

Figure 2:
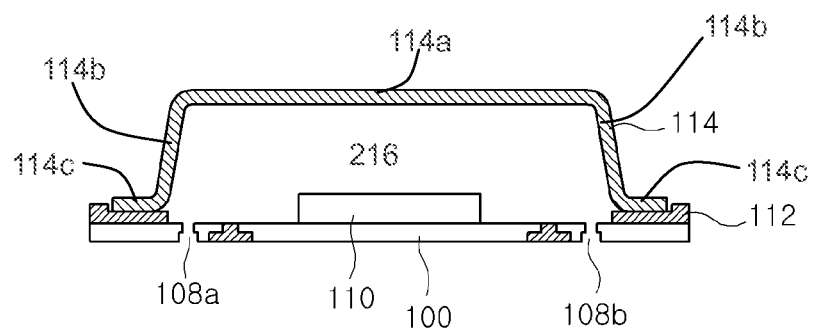
FIG. 2 illustrates a side and cross-sectional view of a lead frame package according to the embodiment of FIG. 1.

Turning now to the drawings, FIG. 1 illustrates a top plan view of a lead frame package 10 according to one embodiment, and FIG. 2 is a side and cross-sectional view of the lead frame package of FIG. 1. In FIG. 1, a plurality of leads 104 are formed on respective sides (for example, four sides of a quadrangle or multiple sides of a polygon shape) of a lead frame 100. In one embodiment, plurality of leads 104 can surround a die paddle 102 that is formed substantially in the center portion of lead frame 100. One or more electronic chips or devices 110 are attached to die paddle 102. By way of example, electronic chips 110 can be semiconductor sensor devices including acceleration sensors, wheel speed sensors, slope sensors, knock sensors, vehicle speed sensors, temperature sensors, air pressure sensors, acoustic sensors, or similar devices as known to those of ordinary skill in the art. Electronic chips 110 can be discrete sensor devices, integrated sensor devices, or can comprise multiple sensor devices on a single chip. In one embodiment, respective ones of plurality of leads 104 can be electrically connected to respective bond pads (not illustrated), which are formed on electronic chip 110, through, for example, conductive wires (not illustrated) or similar connecting structures as known to those of ordinary skill in the art.

In one embodiment, one or more discharge holes 108a, 108b, 108c, and 108d are formed in and extending through one or more specific leads 106a, 106b, 106c, and 106d (for example, in one embodiment four leads proximate to the four corners of lead frame 100) of the plurality of leads 104 that are formed on the respective sides to surround die paddle 102. In one embodiment, discharge holes 108a to 108d are formed in and extending through ends of specific leads 106a to 106d that are proximate to die paddle 102. In accordance with the present embodiment, discharge holes 108a to 108d are configured to discharge air pressure in a cavity 216 (illustrated in FIG. 2) where electronic chip 110 is mounted to the outside environment when a cover 114 is attached to a predetermined position of lead frame 100 to seal electronic chip 110. In accordance with the present embodiment, discharge holes 108a to 108d are formed on locations of specific leads 106a to 106d so that discharge holes 108a to 108d are within cavity 216 after cover 114 is attached to lead frame 100. In one embodiment and as illustrated in FIG. 2, cover 114 can be a single-piece cover having an upper portion 114a above, substantially parallel to and spaced apart from electronic chip 110 and lead frame 100, and side portions 114b extending from upper portion 114a downward towards lead frame 100. In one embodiment, cover 114 further includes foot portions 114c configured for mounting to lead frame 110. In accordance with the present embodiment, discharge holes 108a to 108d are formed in the lead frame structure that is opposing and spaced apart from upper portion 114a of cover 114 with cavity 216 therebetween.

In another embodiment, discharge holes are formed in two leads proximate to corners of the quadrangle, which face each other in a diagonal direction in the lead frame 100. For example, this could be specific leads 106a and 106c having discharge holes 108a and 108c respectively, or this could be specific leads 106b and 106d having discharge holes 108b and 108d respectively. In one embodiment and as illustrated in FIG. 1, one or more specific leads 106a to 106d can be configured having a wider portion 116 to accommodate the discharge holes and to also allow space for conductive connective structures to attach to the leads.

Referring to FIG. 2, cover 114, which is to seal a cavity region in which the semiconductor chip 110 and the plurality of leads 104 are formed, is adhered or attached to a predetermined position of the lead frame 100 using, for example, an adhesive layer 112. The cover 114 can be made of, for example, a stainless material, such as copper, or a plastic material having high rigidity. Further, adhesive layer 112 for attaching the cover 114 to a target position on lead frame 100 can be, for example, solder paste or epoxy paste. It is understood that other methods can be used to attach cover 114 to lead frame 100.

In accordance with the present embodiment, lead frame package 10 is configured to have discharge holes (for example, discharge holes 108a to 108b) formed in and extending through one or more specific leads, and thus, rotation, tilting and/or separation of the cover with respect to the lead frame due to air pressure build-up within the cavity is reduced when the cover is attached to the leadframe. The present embodiment improves the reliability of the lead frame packaged electronic device(s). The present embodiment also supports the use of a single piece cover without holes formed therein, which protects the electronic chip while in use particularly in an extreme environment such as such as environments that vehicles are exposed to.

Figure 3A:
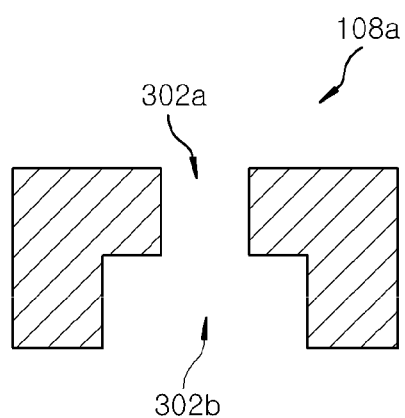
FIGS. 3A and 3B are cross-sectional views illustrating the structure of a discharge hole in accordance with the present invention.
Figure 3B:
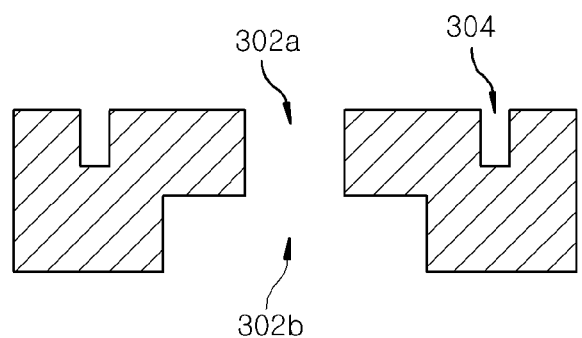

FIGS. 3A and 3B are cross-sectional views illustrating a discharge hole structure that is configured for use in the present embodiments. Referring to FIG. 3A, discharge hole 108a (as well as any one of or all of discharge holes 108b to 108d) can be formed on a specific lead (for example, specific lead 106a) and has a first hole portion 302a extending inward from one side of lead frame 100, and second hole portion 302b extending inward from the opposite side of lead frame 100. In one embodiment, first hole portion 302a is provided on the same side of lead frame 100 that electronic chip 110 is attached. In one embodiment, it is preferable that the diameter of first hole portion 302a be smaller than the diameter of the second hole portion 302b. This configuration was found to reduce or prevent adhesives, which are used to mount or attach lead frame package 10 onto a next level of assembly, such as a printed circuit board, from flowing into cavity region 216. This also improves the reliability of lead frame package 10.

Referring now to FIG. 3B, in another embodiment, a catching member, groove, slot, or channel 304 can be formed in specific leads 106a to 106d of lead frame 100, for example, in proximity to first hole portion 302a of discharge holes 108a to 108d. In one embodiment, catching member 304 can surround first hole portion 302a of discharge holes 108a to 108d. In the present embodiment, catching member 304 is configured to prevent (or reduce the effects of) adhesives from flowing into cavity region 216 when lead frame package 10 is mounted or attached to the next level of assembly such as a printed circuit board. In one embodiment, catching member 304 can be configured as a concave groove that surrounds the vicinity of the first hole portion 302a to prevent the adhesives from being diffused over the vicinity of the discharge hole. This configuration further improves the reliability of lead frame package 10.

Lead frame package 10 can be manufactured through a series of process steps as illustrated hereinafter. First, lead frame 100 having sides, which surround the die paddle 102 and on which the plurality of leads 104 are formed, is prepared, and the discharge holes 108a to 108d are formed on one or more specific leads 106a to 106d of the plurality of leads 104 through an etching or milling process.

In one embodiment for forming the discharge hole(s) 108a to 108d, first hole portion 302a having the smaller diameter can be formed by performing a first etching process on one side of lead frame 100, and second hole portion 302b having the larger diameter can be formed from the opposite side of lead frame 100 using a second etching process. In one embodiment, first hole portion 302a is formed on the same side of lead frame 100 where electronic chip 110 will be attached.

In one embodiment, catching member 304 can be formed on specific leads 106a to 106d as a concave groove that surrounds the vicinity of first hole portion 302a having the smaller diameter than second hole portion 302b so as to prevent or suppress adhesives, which are used to attach lead frame package 10 to a next level of assembly, from flowing into the cavity region, and to prevent or suppress the adhesives from being diffused over the vicinity of the discharge hole. In one embodiment, catching member 304 can be formed using an etching or milling process.

In a further step, electronic chip 110 is attached to a target position on die paddle 102 using, for example, an adhesive material, and window, cover, or case 114 for sealing plurality of leads 104 and electronic chip 110 is adhered or attached to a target position on lead frame 100 through adhesive layer 112 to thereby complete the manufacturing of lead frame package 10. In one embodiment, lead frame package 10 according to the present embodiment is configured as an electronic sensor package for a vehicle application.

Figure 4:
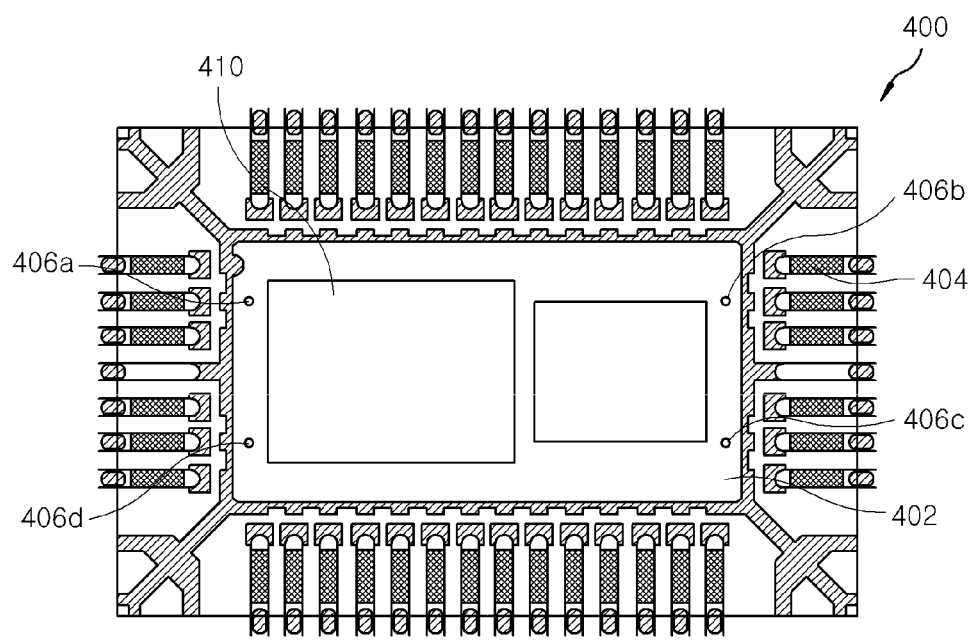
FIG. 4 illustrates a top plan view of a lead frame package according to another embodiment of the present invention.
Figure 5:
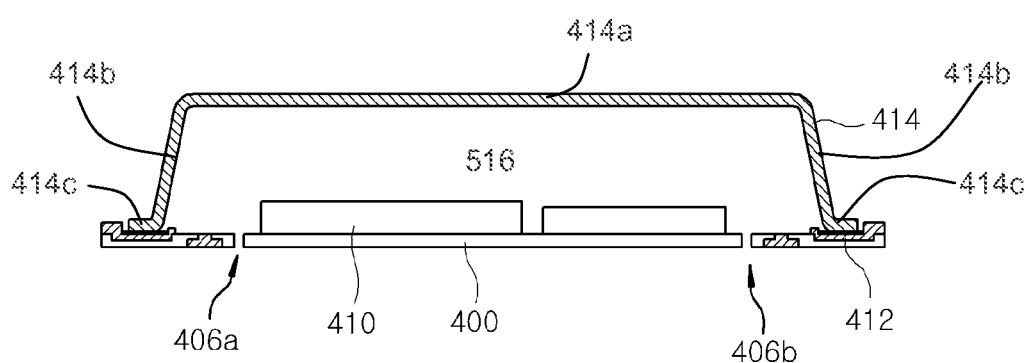
FIG. 5 illustrates a side and cross-sectional view of a lead frame package according to the embodiment of FIG. 4.

Referring now to FIG. 4 a plan view of a lead frame package 20 according to another embodiment is illustrated. FIG. 5 illustrates a side and cross-sectional view of lead frame package 20. As illustrated in FIG. 4, a plurality of leads 404 are formed on respective sides (for example, four sides of a quadrangle or multiple sides of a polygonal shape) of a lead frame 400, which surround a die paddle 402 that is formed substantially in the center portion of the lead frame 400. One or more electronic chips or devices 410 are attached to die paddle 402. By way of example, electronic chips 410 can be semiconductor sensor devices including acceleration sensors, wheel speed sensors, slope sensors, knock sensors, vehicle speed sensors, temperature sensors, air pressure sensors, acoustic sensors, or similar devices as known to those of ordinary skill in the art. Electronic chips 410 can be discrete sensor devices, integrated sensor devices, or can comprise multiple sensor devices on a single chip. In one embodiment, one of electronic chips 410 can be integrated circuit configured to control a sensor device. In one embodiment, respective ones of leads 404 can be electrically connected to respective bond pads (not illustrated), which are formed on electronic chips 410, through, for example, conductive wires (not illustrated) or similar connecting structure as known to those of ordinary skill in the art.

One or more discharge holes 406a, 406b, 406c, and 406d are formed on one or more predetermined positions and extending through die paddle 402. In one embodiment, the discharge holes can be formed proximate to the four corners of die paddle 402. In another embodiment, discharge holes can placed proximate to two corners on a diagonal direction from each other. In accordance with the present embodiment, discharge holes 406a to 406d are configured to discharge air pressure in a cavity 516 (illustrated in FIG. 5 as the cavity in which the electronic chip 410 is mounted) to the outside environment when a cover 414 is attached to a predetermined position of lead frame 400 to seal electronic chips 410. In accordance with the present embodiment, discharge holes 408a to 408d are formed on locations of die pad 402 so that discharge holes 408a to 408d are within cavity 516 after cover 414 is attached to lead frame 400. In one embodiment and as illustrated in FIG. 5, cover 414 can be a single-piece cover having an upper portion 414a above, substantially parallel to and spaced apart from electronic chip 410 and lead frame 400, and side portions 414b extending from upper portion 414a downward towards lead frame 400. In one embodiment, cover 414 further includes foot portions 414c configured for mounting to lead frame 410. In accordance with the present embodiment, discharge holes 406a to 406d are formed in the lead frame structure that is opposing and spaced apart from upper portion 414a of cover 414 with cavity 516 therebetween.

Referring to FIG. 5, window 414, which is to seal a cavity region in which the electronic chips 410 and the plurality of leads 404 are formed, is adhered to a predetermined position of the lead frame 400 through an adhesive layer 412. The cover 414 may be made of, for example, a stainless material, such as copper, or a plastic material having high rigidity. Further, adhesive layer 412 for attaching the cover 414 to a target position of the lead frame 400 can be, for example, solder paste or epoxy paste.

In accordance with the present embodiment, lead frame package 20 is configured to have one more discharge holes formed in one or more locations of die pad 402, and thus, rotation, tilting and/or separation of the cover with the respect to the lead frame due to air pressure build-up within the cavity when the cover is attached to the leadframe is reduced. This improves the reliability of the lead frame packaged electronic device(s). The present embodiment also supports the use of a single piece cover without holes formed therein, which protects the electronic chip while in use particularly in an extreme environment such as in a vehicle.

Further, in the same manner as the embodiment of FIG. 3A described previously, the discharge holes (for example, discharge holes 406a to 406d) according to the present embodiment can include the first hole portion 302a and second hole portion 302b configuration. Specifically, first hole portion 302a can be formed on the same surface of die paddle 402 where electronic chips 410 are attached, and second hole portion 302b can be formed on the opposite side of die paddle 402. As described previously, the diameter of first hole portion 302a is preferably smaller than the diameter of second hole portion 302b. This configuration was found to reduce or prevent adhesives, which are used to mount or attach lead frame package 20 onto a next level of assembly, such as a printed circuit board, from flowing into cavity region 516. This also improves the reliability of lead frame package 20.

Further, in the same manner as the embodiment of FIG. 3B, lead frame package 20 can include slot or catching member 304 formed on the top surface of die paddle 402 in proximity to first hole portion 302a of discharge holes 406a to 406d. In one embodiment, catching member 304 can surround first hole portion 302a of discharge holes 406a to 406d. In the present embodiment, catching member 304 is configured to prevent (or reduce the effects of) adhesives from flowing into cavity region 516 when lead frame package 20 is mounted or attached to the next level of assembly such as a printed circuit board. In one embodiment, catching member 304 can be configured as a concave groove that surrounds the vicinity of the first hole portion 302a to prevent the adhesives from being diffused over the vicinity of the discharge hole. This configuration further improves the reliability of lead frame package 20.

Those skilled in the art will understand that other embodiments can include one or more of discharge holes 108a to 108d and one or more discharge holes 406a to 406d and that one or more discharge holes may include the discharge hole configuration illustrated and described in FIG. 3A. Further, one or more discharge holes can include the catching member configuration illustrated and described in FIG. 3B.

Lead frame package 20 can be manufactured through a series of process steps as illustrated hereinafter. First, the lead frame 400 having the sides, which surround the die paddle 402 and on which the plurality of leads 404 are formed, is prepared, and the discharge holes 406a to 406d are formed on one or more positions of the die paddle 402 through an etching or milling process.

In one embodiment for forming the discharge hole(s) 406a to 406d, first hole portion 302a having the smaller diameter can be formed by performing a first etching process on one side of die paddle 402, and a second hole portion 302b having the larger diameter can be formed from the opposite side of die paddle using a second etching process. In one embodiment, first hole portion 302a is formed on the same side of die paddle 402 where electronic chips 410 will be attached.

In one embodiment, catching member 304 can be formed on die paddle 402 as a concave groove that surrounds the vicinity of first hole portion 302a having the smaller diameter than second hole portion 302b so as to prevent or suppress adhesives, which are used to attach lead frame package 20 to a next level of assembly, from flowing into the cavity region, and to prevent or suppress the adhesives from being diffused over the vicinity of the discharge hole.

In a further step, electronic chips 410 are attached to target positions on die paddle 402 using, for example, an adhesive material, and the window, cover, or case 414 for sealing plurality of leads 404 and electronic chip 410 is adhered or attached to a target position on lead frame 400 through adhesive layer 412 to thereby complete the manufacturing of lead frame package 20. In one embodiment, lead frame package 20 according to the present embodiment is configured as an electronic sensor package for a vehicle application.

In view of all the above, it is evident that a novel structure and method is disclosed. Included, among other features, is a lead frame having a plurality of leads, a die paddle, and an electronic chip attached to the die paddle. A window covers the die paddle, the electronic chip and portions of the plurality of leads to form a cavity. One or more discharge holes are formed extending through specific leads and/or portions of the die paddle within the cavity to allow for the displacement of air that builds up when the window is attached to the lead frame. The discharge holes are configured to reduce unwanted tilting, separation, and/or rotation of the window thereby improving the reliability of the lead frame packaged electronic device.

While the subject matter of the invention is described with specific preferred embodiments and example embodiments, the foregoing drawings and descriptions thereof depict only typical embodiments of the subject matter and are not, therefore, to be considered limiting of its scope. It is evident that many alternatives and variations will be apparent to those skilled in the art. For example, the subject matter has been described for sensor devices; however, the method and structure is directly applicable to other electronic devices, such as semiconductor devices, optoelectronic devices, imaging devices, solar cells, medical devices, and other devices configured for vehicle applications or applications where the electronic components must operate under extreme environmental conditions.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and form different embodiments, as would be understood by those skilled in the art.

What is claimed is:

1. A lead frame package structure comprising:
a lead frame including a die paddle and plurality of leads in proximity to the die paddle;
a discharge hole extending through at least one specific lead of the plurality of leads;
an electronic chip on the die paddle; and
a case attached to the lead frame, the case defining a cavity between the lead frame and an upper portion of the case, wherein the discharge hole, the electronic chip and at least portions of the plurality of leads are within the cavity, and wherein the discharge hole is open and configured to discharge air pressure in the cavity.

2. The structure of claim 1, wherein:
the lead frame has a quadrangle shape;
at least two leads of the plurality of leads include discharge holes; and
the two leads are provided in proximity to corners of the quadrangle shape that face each other in a diagonal direction in the lead frame.

3. The structure of claim 1, wherein four leads of the plurality of leads are provided in proximity to four corners of the lead frame with each of the four leads including a discharge hole open in the lead frame package structure.

4. The structure of claim 1, wherein:
the discharge hole has a first hole portion on one side of the at least one specific lead and a second hole portion on the opposite side; and
the first hole portion has a diameter that is smaller than the diameter of the second hole portion.

5. The structure of claim 4, further comprising a slot in the at least one specific lead in proximity to the first hole portion.

6. The structure of claim 5, wherein the slot is a concave groove that surrounds the first hole portion.

7. The structure of claim 1, wherein the case is attached to the lead frame with one of a solder paste adhesive or an epoxy paste adhesive.

8. A lead frame package structure comprising:
a lead frame having sides, which surround a die paddle and on which a plurality of leads are formed in proximity to a die paddle, wherein one or more discharge holes extend through predetermined locations on the lead frame;
an electronic chip on the die paddle; and
a cover adhered to the lead frame defining a cavity between the lead frame and the cover, wherein the electronic chip, the one or more discharge holes, at least portions of plurality of leads, and the die paddle are within the cavity, and wherein the one or more discharge holes are open in the lead frame package structure.

9. The structure of claim 8, wherein the die paddle includes a discharge hole.

10. The structure of claim 8, wherein at least one lead of the plurality of leads includes a discharge hole.

11. The structure of claim 8, wherein:
at least one discharge hole has a first hole portion on one side of the lead frame and a second hole portion on an opposite side of the lead frame; and
the first hole portion has a diameter that is smaller than that of the second hole portion.

12. The structure of claim 11, further comprising a slot in proximity to the at least one discharge hole.

13. The structure of claim 12, wherein the slot is a concave groove surrounding the first hole portion.

14. The structure of claim 8, wherein the cover is adhered to the lead frame by one of a solder paste adhesive or an epoxy paste adhesive.

15. A method for manufacturing a lead frame package, comprising:
    providing a lead frame having sides, which surround a die paddle and on which a plurality of leads are formed, and discharge holes extending through the lead frame on one or more locations;
    attaching an electronic chip to the die paddle; and
    attaching a case for sealing the plurality of leads and the electronic chip to the lead frame, the case defining a cavity between a portion of the lead frame and an upper surface of the case, wherein the discharge holes are configured to discharge air pressure in the cavity.

16. The method of claim 15, wherein providing the lead frame includes providing the lead frame having at least one discharge hole in a lead of the plurality of leads.

17. The method of claim 15, wherein providing the lead frame includes providing the lead frame having at least one discharge hole in the die paddle.

18. The method of claim 15, wherein:
    providing the lead frame includes providing the lead frame having at least one discharge hole comprising a first hole portion on one side of the lead frame and a second hole portion on an opposite side of the lead frame; and
    the first hole portion has diameter that is smaller than that of the second hole portion.

19. The method of claim 15, wherein:
    providing the lead frame includes providing a lead frame further comprising a slot formed in proximity to at least one discharge hole, and where the slot and the electronic chip are on the same side of the lead frame; and
    attaching the case to the lead frame comprises attaching the case with an adhesive layer.

20. The method of claim 19, wherein providing the lead frame includes providing the lead frame where the slot comprises a concave groove surrounding the at least one discharge hole.

* * * * *